(12) United States Patent
Jung et al.

(10) Patent No.: US 6,391,518 B1
(45) Date of Patent: May 21, 2002

(54) POLYMERS AND PHOTORESIST COMPOSITIONS USING THE SAME

(75) Inventors: Min Ho Jung; Jae Chang Jung; Geun Su Lee; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/360,402

(22) Filed: Jul. 23, 1999

(30) Foreign Application Priority Data

Jul. 27, 1998 (KR) .............................. 98-30098

(51) Int. Cl.$^7$ ........................ G03F 7/004; C08F 10/00

(52) U.S. Cl. .................... 430/270.1; 430/326; 526/272; 526/281; 526/219.6; 526/227; 528/298; 528/306

(58) Field of Search ............... 430/270.1, 325, 430/326; 526/281, 271, 272, 219.6, 227; 562/499; 528/306, 298

(56) References Cited

U.S. PATENT DOCUMENTS

| | | | |
|---|---|---|---|
| 3,370,047 A | 2/1968 | Raines | 260/78.5 |
| 4,011,386 A | 3/1977 | Matsumoto et al. | 526/259 |
| 4,106,943 A | 8/1978 | Ikeda et al. | 96/115 R |
| 4,202,955 A | 5/1980 | Gaylord | 526/272 |
| 4,491,628 A | 1/1985 | Ito et al. | 430/176 |
| 4,883,740 A | 11/1989 | Schwalm et al. | 430/270 |
| 5,087,677 A | 2/1992 | Brekner et al. | 526/160 |
| 5,212,043 A | 5/1993 | Yamamoto et al. | 430/192 |
| 5,252,427 A | 10/1993 | Bauer et al. | 430/270 |
| 5,278,214 A | 1/1994 | Moriya et al. | 524/238 |
| 5,585,219 A | 12/1996 | Kaimoto et al. | 430/270.1 |
| 6,143,466 A | * 11/2000 | Choi | 430/270.1 |
| 6,150,069 A | * 11/2000 | Jung et al. | 430/270.1 |

FOREIGN PATENT DOCUMENTS

| | | |
|---|---|---|
| EP | 0 071 571 | 7/1982 |
| EP | 0 291 970 | 5/1988 |
| EP | 0 789 278 | 8/1997 |
| EP | 794458 | 9/1997 |
| EP | 0 836 119 | 4/1998 |
| GB | 0768813 | 2/1957 |
| GB | 1329997 | 9/1973 |
| GB | 1342112 | 12/1973 |
| GB | 1484061 | 8/1977 |
| GB | 2320718 | 12/1997 |
| GB | 2320501 | 6/1998 |
| GB | 2 320 717 | 7/1998 |
| GB | 2321060 | 7/1998 |
| NL | 128164 | 11/1977 |
| NL | 1010914 | 8/1999 |
| WO | WO 96/37526 | 11/1996 |
| WO | WO 97/33198 | 9/1997 |
| WO | WO 99/14256 | 3/1999 |

OTHER PUBLICATIONS

Briggs, S.P. et al, J.C.S. Perkin Tran.I, 1, 1981, 146–149.*
Clemans, G.B. et al, J. Org.Chem., 37(14), 1972, 2312–2317.*
U.S. application No. 09/223,662, Jung et al., filed Dec. 30, 1998.
Japanese Abstract Pub. 05297591 pub. Nov. 12, 1993 for Application No. 04099967, Apr. 1992, Japan.
WPI Abstract No. 99–076491 & JP10316720, Feb. 1998, Japan.
Thomas I. Wallow, et al., "Evaluation of Cycloolefin–Maleic Anhydride Alternating Copolymers as Single–Layer Photoresist for 193nm Photolithography," *Proc. SPIE*, vol. 2724, 1996, pp. 355–364.

(List continued on next page.)

*Primary Examiner*—Rosemary E. Ashton
(74) *Attorney, Agent, or Firm*—Townsend and Townsend and Crew LLP

(57) ABSTRACT

The present invention provides a photoresist monomer represented by the following formula 2; a photoresist copolymer represented by the following formula 100; and a photoresist composition containing the same.

<Chemical Formula 2>

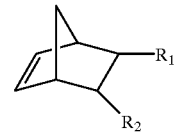

wherein, R1 and R2 are independently —COOH or —R—COOH; and R is a substituted or unsubstituted (C1–C10) alkyl.

<Chemical Formula 100>

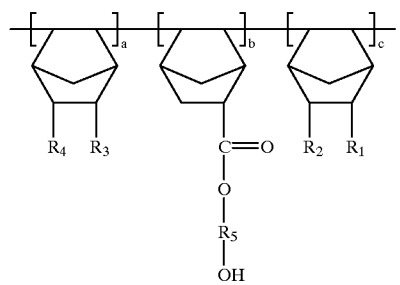

wherein, R1 and R2 are independently —COOH or —R—COOH ; R is a substituted or unsubstituted (C1–C10) alkyl; R3 is —COOR* or —R'COOR*; R* is an acid labile group; R' is a substituted or unsubstituted (C1–C10) alkyl; R4 is H or R3; R5 is a substituted or unsubstituted (C1–C10) alkyl; and a:b:c is the polymerization ratio of the comonomer.

29 Claims, 2 Drawing Sheets

OTHER PUBLICATIONS

R.D. Allen et al., "The Influence of Photoacid Structure on the Design and Performance of 193nm Resists," *Journal of Photopolymer Science and Technology*, vol. 10, 1997, pp. 503–510.

F.M. Houlihan et al., "A Commercially Viable 193nm single Layer Resist Platform,", *Journal of Photopolymer Science and Technology*, vol. 10, 1997, pp. 511–520.

J.C. Jung et al., "ArF Single Layer Resist Composed of Alicyclic Main Chain Containing Maleic Anhydride," *Journal of Photopolymer Science and Technology*, vol. 10, 1997, pp. 529–533.

S.J. Choi et al., "New ArF Single–layer Resist for 193–nm Lithography," *Journal of Photopolymer Science and Technology*, vol. 10, 1997, pp. 521–528.

T. Hattori et al., "Synthesis and Dissolution Characteristics of Novel Alicyclic Polymer With Monoacid Ester Structures," *Journal of Photopolymer Science and Technology*, vol. 10, 1997, pp. 535–544.

K. Nozaki and Ei Yaro, "New Protective Groups in Methacrylate Polymer for 193–nm Resists," *Journal of Photopolymer Science and Technology*, vol. 10, 1997, pp. 545–550.

K. Nakano et al., "Chemically Amplified Resist Based on High Etch–Resistant Polymer for 193–nm Lithography," *Journal of Photopolymer Science and Technology*, vol. 10, 1997, pp. 561–569.

Alexander A. Dobrev, Emile Perez, Jean Claud Ader, Armand Lattes, "First Application of Functionalized in the Ester Moiety Acrylates in Diels–Alder Reaction: Invluence of Solvents on Stereochemistry," *Bulgarian Chemical Communications*, vol. 28, No. 2, 1995, pp. 253–258.

T.P. McGovern and C.E. Schreck, "Mosquito Repellents: Monocarboxylic Esters of Aliphatic Diols", *Journal of the American Mosquito Control Association*, vol. 4, No. 3, pp. 314–321.

Uzodinma Okoroanyanwu et al., "New Single Layer Positive Photoresists for 193 nm Photolithography," *SPIE*, vol. 3049, 1997, pp. 92–103.

ACS Abstract Ref. 172992–05–1.

ACS Abstract Ref. 172992–04–0.

CA Ref. No. 1996: 58168 Chem. Mater. (1996), 8(2), pp. 440–447.

CA Ref. No. 1996:58162 Chem. Mater. (1996), 8(2), pp. 376–381.

CA Register No. 100207–98–5.

CA Register No. 32759–57–2.

CA Register No. 27056–70–8.

CA Register No. 174659–58–6.

CA Register No. 28503–41–5.

CA Register No. 194997–59–6.

CA Abstract No. 104:149512 & Macromolecules 19(4) 1266–8 (1986).

CA Abstract No. 91:124064 & Makromol. Chem. 180(8) 1975–88 (1979).

CA Abstract No. 113:24734 & JP 02 051511.

CA Abstract No. 127:227269 & J Photopolym. Sci. Technol. 10(4) 529–534 (1997).

CA Abstract No. 124:317926 & Marcomol. Rapid Commun. 17(3) 173–180 (1996).

CA Abstract No. 124:203171 & Macromolecules 29(8) 2755–63 (1996).

CA Abstract No. 66:18889 & Magy. Kem. Foly. (1966) 72(11)491–3.

CA Abstract No. 199328–07–9.

CA 1981:47831 Vesti Akad, Navuk BSSR, Ser. Khim. Navuk (1980) 5, pp. 128–130.

Registry No. 37503–43–8.

\* cited by examiner

POLYMERS AND PHOTORESIST COMPOSITIONS USING THE SAME

FIELD OF THE INVENTION

The present invention relates to a photoresist polymer that is employed in a photolithography process for the manufacture of a semiconductor device, more specifically, a photolithography process using extremely short wavelength-light such as ArF and KrF, which would be applied to the manufacture of 1 G or 4 G DRAM semiconductor devices.

BACKGROUND OF THE INVENTION

Recently, the trend towards the high integration of semiconductor devices has accelerated, and this is much affected by the development of techniques for forming a micro-pattern using photoresist polymers. In order to prepare a micro-pattern, a minute pattern is formed on a photoresist (hereinafter, sometimes abbreviated as "PR"), which is widely used as a mask in a preparation of a semiconductor device, and therefore a suitable photoresist is an indispensable requirement for these processes.

Up to the present time, methods that have been suggested for forming an ultramicroscopic pattern of not more than 0.5 μm include: (1) a contrast enhancement layer (here-in-after, abbreviated to as "CEL") method wherein an additional film is formed on a wafer to enhance the image contrast, (2) a method of using a phase reversal mask, and (3) a method of silylating the surface of a PR film. However, these methods have several disadvantages, such as complicated processes and insufficient yield.

A popular method of increasing the resolution of the PR pattern is to use a light source of the deep ultraviolet band of the light spectrum (hereinafter referred to as "DUV") which requires a PR polymer adapted for use with such a light source.

A chemical amplified-type PR composition, which is prepared by blending a photoacid generator (PAG) and a polymer having a structure of sensitively reacting with an acid, are widely used as a PR for DUV. According to the reaction mechanism of the chemical amplified-type PR, the photoacid generator generates acid when it is illuminated by the light source, and substituents on the main chain or branched chain of the PR polymer are decomposed or crosslinked in a reaction with the generated acid. This change in the polymer creates a solubility difference between the exposed portion and unexposed portion to the developing solution, to form a PR pattern. In view of the reaction mechanism, a PR for DUV, in particular for ArF radiation (193 nm), requires low light absorption at a wavelength of 193 nm, etching resistance, adhesiveness and developing ability in 2.38 wt % aqueous TMAH (tetramethylammonium hydroxide) solution.

Prior art research has been focused on novolac-type resins because of their high transparency at 193 nm and good etching resistance. As an example of such research, the compound represented by Chemical Formula 1 shown below has been developed by Bell Laboratory.

<Chemical Formula 1>

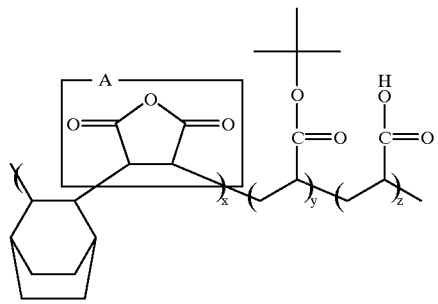

However, the 'A' portion of the compound (that is, maleic anhydride), which is employed to polymerize alicyclic olefin groups, is readily dissolved in 2.38 wt % aqueous TMAH solution even in unexposed regions of the PR film, so that a good pattern cannot be formed. In order to prevent the phenomenon, the amount of the monomer including the tert-butyl group (the 'y' portion) should be increased, but this results in relative decrease of 'z' portion and lowers adhesiveness with the substrate and sensitivity. In order to solve the problem, a cholesterol-type dissolution inhibitor has been added to the PR composition. However, since the amount of the dissolution inhibitor is typically very high [about 30%(w/w) of the resin], reappearance is low and the production cost are high, thereby making the composition unsuitable as a PR composition.

SUMMARY OF THE INVENTION

The present invention relates to a PR which solves the problems described above. The invention provides novel photoresist polymers having good etching resistance and adhesiveness, are developable in 2.38 wt % aqueous TMAH solution, and are suitable for a photoresist having high sensitivity, and a process for preparing the same. The present invention also provides photoresist compositions and semiconductor devices employing the novel photoresist polymers, and a process for preparing the same.

The present invention provides a novel photoresist polymer comprising a monomer represented by following Chemical Formula 2:

<Chemical Formula 2> wherein, R1 and R2 are independently —COOH or —R—COOH; and R is a substituted or unsubstituted (C1–C10) alkyl.

The present invention also provides a photoresist polymer represented by the following Chemical Formula 100.

<Chemical Formula 100>

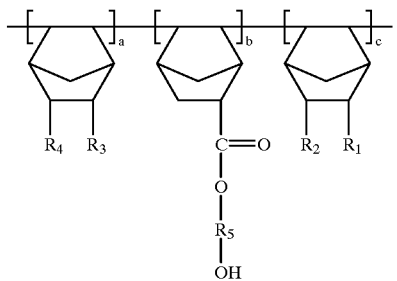

wherein, R1 and R2 are independently —COOH or —R—COOH; R is a substituted or unsubstituted (C1–C10) alkyl;

R3 is —COOR* or —R'—COOR*; R* is an acid labile group; R' is a substituted or unsubstituted (C1–C10) alkyl;

R4 is H or R3;

R5 is a substituted or unsubstituted (C1–C10) alkyl; and a, b and c are independently polymerization ratios of each comonomer.

In addition, the present invention also provides a photoresist composition containing (i) a photoresist copolymer of Chemical Formula 100 above, (ii) a photoacid generator, and (iii) an organic solvent.

DETAILED DESCRIPTION OF THE INVENTION

Figure 1:
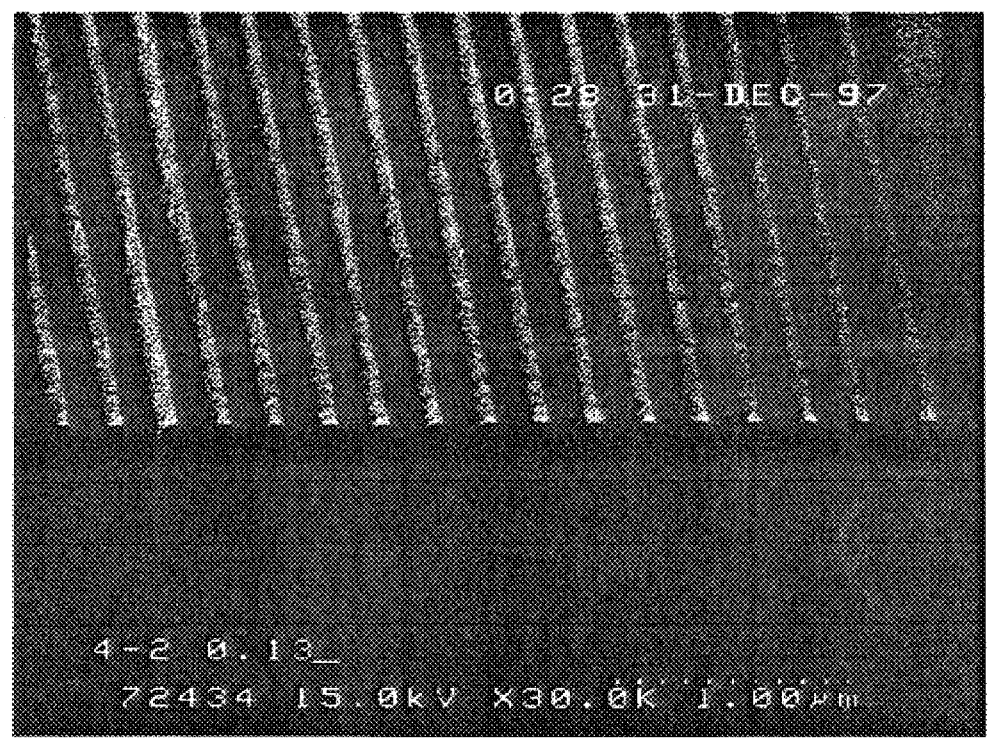
FIG. 1 is a SEM photograph showing a photoresist pattern that was obtained according to an embodiment of the present invention.

After many experiments and research, it has been discovered that the introduction of the compound of Chemical Formula 2 as a monomer of a PR polymer can enhance the contrast ratio between exposed regions and unexposed regions of a photoresist element.

Generally, in the case of a chemical amplified type of PR, the amount of carboxy groups is increased in the exposed region, because an acid liable group present in the polymer is dissociated due to reaction with an acid to form a carboxy group, while the amount of carboxy groups is not changed in the unexposed region. Since the monomer according to the present invention already has two carboxy groups, it is possible to obtain a sufficient contrast ratio using smaller amounts of monomer containing carboxy groups.

In addition, monomers according to the present invention do not exhibit a disagreeable odor and are convenient to prepare and react. Furthermore, monomers according to the present invention, especially 5-norbornene-2,3-dicarboxylic acid, are inexpensive. Accordingly, monomers of the present invention are advantageous in mass-production manufacturing processes.

In Chemical Formula 2 above, the R is preferably an unsubstituted, linear or branched C1–C5 alkyl and more preferably, the R1 and R2 are both —COOH.

Preferred photoresist polymers according to the present invention comprise (i) a photoresist monomer of the present invention, that is, a compound represented by Chemical Formula 2 and, (ii) at least one of a dissolution inhibitor represented by the following Chemical Formula 3 and an adhesion-enhancing material represented by the following Chemical Formula 4.

<Chemical Formula 3>

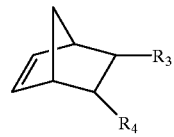

wherein,

R3 is —COOR* or —R'—COOR*; R* is an acid labile group; R' is a substituted or unsubstituted (C1–C10) alkyl; and R4 is H or R3.

<Chemical Formula 4>

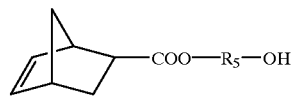

wherein, R5 is a substituted or unsubstituted (C1–C10) alkyl.

In the dissolution inhibitor represented by the Chemical Formula 3, the R* is dissociated by the acid generated in the exposed regions and then the exposed regions becomes dissolved by an alkaline developer in the subsequent developing process. However, the R* group is not subject to dissociation in the unexposed regions and thus the unexposed region remains as it was after developing process. As the result, a predetermined pattern is formed.

Therefore, the acid labile group R* may be any group that can be dissociated by an acid. Such groups include substituted or non-substituted aliphatic or cyclic alkyl, substituted or non-substituted aliphatic or cyclic alkoxyalkyl, substituted or non-substituted aliphatic or cyclic ester, substituted or non-substituted aliphatic or cyclic carboxylate, substituted or non-substituted aliphatic or cyclic ketone and so on. Preferably, R* is t-butyl, 2-tetrahydroxypyranyl, 2-tetrahydroxyfuranyl, 2-ethoxyethyl or t-butoxyethyl.

Examples of the dissolution inhibitor represented by the Chemical Formula 3 are compounds represented by the following Chemical Formulas 21 to 25:

<Chemical Formula 21>(di-tert-butyl 5-norbornene-2, 3-dicarboxylate)

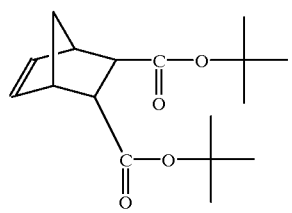

-continued

<Chemical Formula 22>(ditetrahydropyranyl 5-norbornene-2,3-dicarboxylate)

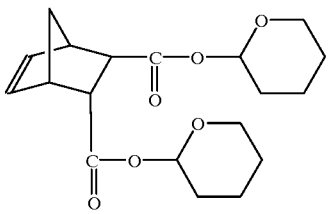

<Chemical Formula 23>(ditetrahydrofuranyl 5-norbornene-2,3-dicarboxylate)

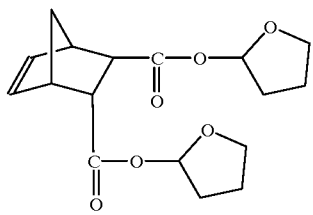

<Chemical Formula 24> (1,1'-ethoxyethyl 5-norbornene-2,3-dicarboxylate)

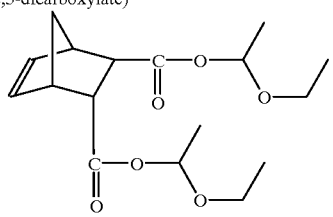

<Chemical Formula 25> (1, 1'-di-tert-butoxyethyl 5-norbornene-2,3-dicarboxylate)

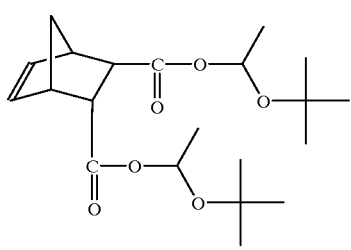

In addition, the dissolution inhibitor represented by the Chemical Formula 3 may be compounds containing a single carboxylate group such as, for example, tert-butyl 5-norbornene-2-carboxylate; tetrahydropyranyl 5-norbornene-2-carboxylate; tetrahydrofuranyl 5-norbornene-2-carboxylate; ethoxyethyl 5-norbornene-2-carboxylate; and tert-butoxyethyl 5-norbornene-2-carboxylate.

In the adhesion-enhancing monomer represented by the Chemical Formula 4, R5 is preferably an aliphatic alkyl with a small number of carbon atoms (i.e. C<4) such as methyl, ethyl and propyl, or a branched alkyl group with a relatively large number of carbon atoms (i.e. C≧4) such as t-butyl.

Most preferably, the adhesion-enhancing monomer represented by the Chemical Formula 4 is 2-hydroxyethyl 5-norbornene-2-carboxylate or 3-hydroxypropyl 5-norbornene-2-carboxylate.

In the case of performing polymerization using a polymerizing initiator, maleic anhydride, maleimide derivatives, vinylene carbonate, etc. can be further added as comonomers in order to enhance polymerization yield. However, in the event that a metallic catalyst is used, polymerization can be performed without using such monomers as maleic anhydride.

Preferred photoresist copolymers according to the present invention are represented by the following Chemical Formula 100.

<Chemical Formula 100>

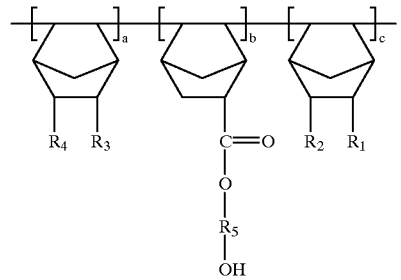

wherein, R1 and R2 are independently —COOH or —R—COOH ; R is a substituted or unsubstituted (C1–C10) alkyl;

R3 is —COOR* or —R'—COOR*; R* is an acid labile group; R' is a substituted or unsubstituted (C1–C10) alkyl;

R4 is H or R3;

R5 is a substituted or unsubstituted (C1–C10) alkyl; and the polymerization ratio of a:b:c=(0.01–99 mole %):(0.01–99 mole %):(0.01–99 mole%).

Preferred polymers of Formula 100 which have been polymerized using a polymerizing initiator are represented by the following Chemical Formula 101.

<Chemical Formula 101>

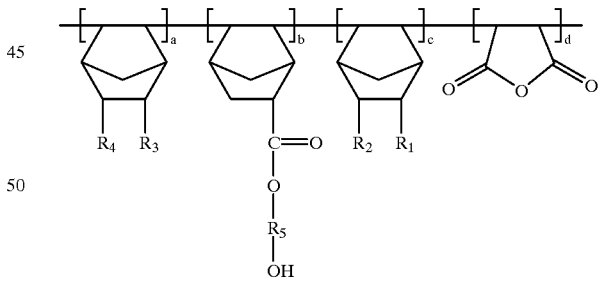

wherein, R1 and R2 are independently —COOH or —R—COOH; R is a substituted or unsubstituted (C1–C10) alkyl;

R3 is —COOR* or —R'—COOR*; R* is an acid labile group; R' is a substituted or unsubstituted (C1–C10) alkyl;

R4 is H or R3;

R5 is a substituted or unsubstituted (C1–C10) alkyl; and the polymerization ratio of a:b:c:d=(0.01–99 mole%):(0.01–99 mole%):(0.01–99 mole%):(0.01–99 mole%).

A typical polymerization process using a polymerizing initiator is as follows:

First, more than two comonomers are dissolved in organic solvent, and then, a polymerization initiator is added thereto and the solution is reacted at 40 to 90° C. for 4 to 20 hours. When the polymerization is completed, the polymer is precipitated with ethyl ether solvent and dried in vacuo to give pure polymer. Suitable organic solvents for polymerization include tetrahydrofuran, toluene, benzene, methyl ethyl ketone, or dioxane, and as a polymerization initiator, and typical radical polymerization initiators include 2,2-azobisisobutyronitile (AIBN), acetyl peroxide, lauryl peroxide and tert-butyl peroxide.

The PR composition according to the present invention can be prepared by mixing a photoresist copolymer of the present invention with a conventional solvent and conventional photoacid generator. The photoacid generator may be a sulfide type or onium type, for example, triphenylsulfonium triflate or dibutylnaphthyl sulfonium triflate. The amount of the photoacid generator is typically 0.05 wt % to 10 wt % of the polymer 0 0 employed. If the amount is less than 0.05 wt %, photosensitivity of the PR is poor, while if the amount is more than 10 wt %, the photoacid generator absorbs far ultraviolet too much to give a pattern having a poor profile.

Conventional organic solvents such as ethyl 3-ethoxypropionate, methyl 3-methoxypropionate, cyclohexanone or propylene glycol methyl ether acetate may be used to prepare PR compositions of the present invention. The amount of the solvent may vary from 200 to 1000 wt % of the polymer employed, depending upon the desired thickness of the resultant PR layer. It has been found that the thickness of the PR layer is about 0.5 μm when the amount of solvent is 600 wt % of the amount of polymer employed.

The invention will now be described in more detail by referring to the following examples, but it is noted that the invention is not limited to such examples:

Synthesis of Photoresist Monomer

EXAMPLE 1

Synthesis of 5-Norbornene-2,3-dicarboxylic Acid

Cyclopentadiene, which was obtained from the pyrolysis of dicyclopentadiene, was dissolved in an organic solvent, and the solution was chilled to −30° C. An equimolar amount of maleic anhydride was slowly added thereto, while maintaining the temperature at −30° C. After performing the reaction for about 10 hours, the reaction was further progressed for 10 hours while slowly raising the temperature to room temperature. When the reaction was completed, the organic solvent was removed by using a rotary evaporator, and 5-norbornene-2,3-dicarboxylic anhydride was obtained by distillation in vacuo. In a reactor, 5-norbornene-2,3-dicarboxylic anhydride (1 mole) obtained above was dissolved in 10 wt % aqueous sodium hydroxide solution with gentle stirring. Then, the temperature was raised to 85° C., and the mixture was refluxed for 1.5 hours, and slowly cooled to room temperature. To the reaction mixture, 10% aqueous sulfuric acid solution was slowly added dropwise to adjust the pH to neutral, and the organic layer was extracted with ethyl acetate by using a separatory funnel. Extraction was repeated several times, and the combined extract was dried over anhydrous magnesium sulfate, and evaporated under reduced pressure to obtain 5-norbornene-2,3-dicarboxylic acid represented by Chemical Formula 11 shown below as pure white solid (yield: 93%).

<Chemical Formula 11>

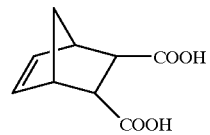

Synthesis of Photoresist Copolymer

EXAMPLE 2

Synthesis of Poly(di-tert-butyl 5-Norbornene-2,3-dicarboxylate/2-Hydroxyethyl 5-Norbornene-2-carboxylate/5-Norbornene-2,3-dicarboxylic Acid/Maleic Anhydride)

<Chemical Formula 102>

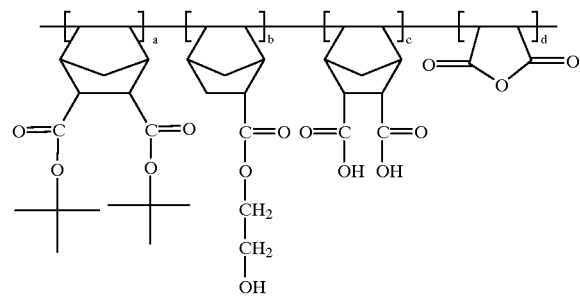

Di-tert-butyl 5-norbornene-2,3-dicarboxylate (0.85 mole), 2-hydroxyethyl 5-norbornene-2-carboxylate (0.1 mole), 5-norbornene-2,3-dicarboxylic acid (0.05 mole) and maleic anhydride (1 mole) were mixed together in tetrahydrofuran solvent, and AIBN (5.5 g) was added to the mixture as a polymerization initiator. Polymerization was performed under nitrogen atmosphere for 10 hours while maintaining the temperature at 67° C. When the polymerization was completed, the polymer was precipitated from ethyl ether and dried in vacuo to obtain pure poly(di-tert-butyl 5-norbornene-2,3-dicarboxylate/2-hydroxyethyl 5-norbornene-2-carboxylate/5-norbornene-2,3-dicarboxylic acid/maleic anhydride) of Chemical Formula 102 shown above (yield: 31%).

EXAMPLE 3

Synthesis of Poly(ditetrahydropyranyl 5-Norbornene-2,3-dicarboxylate/2-Hydroxyethyl 5-Norbornene-2-carboxylate/5-Norbornene-2,3-dicarboxylic Acid/Maleic Anhydride)

<Chemical Formula 103>

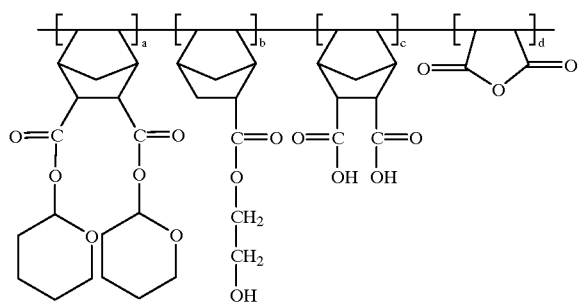

The procedure of the Example 102 was repeated, but using ditetrahydropyranyl 5-norbornene-2,3-dicarboxylate instead of di-tert-butyl 5-norbornene-2,3-dicarboxylate, to obtain poly(ditetrahydropyranyl 5-norbornene-2,3-dicarboxylate/2-hydroxyethyl 5-norbornene-2-carboxylate/5-norbornene-2,3-dicarboxylic acid/maleic anhydride) represented by Chemical Formula 103 shown above (yield: 31.5%).

EXAMPLE 4

Synthesis of Poly(ditetrahydrofuranyl 5-Norbornene-2,3-dicarboxylate/2-Hydroxyethyl 5-Norbornene-2-carboxylate/5-Norbornene-2,3-dicarboxylic Acid/Maleic Anhydride)

<Chemical Formula 104>

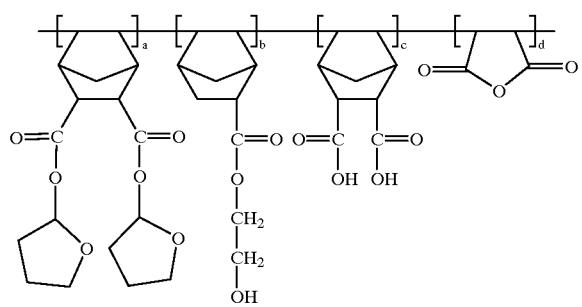

The procedure of the Example 2 was repeated but using ditetrahydrofuranyl 5-norbornene-2,3-dicarboxylate instead of di-tert-butyl 5-norbornene-2,3-dicarboxylate, to obtain poly(ditetrahydrofuranyl 5-norbornene-2,3-dicarboxylate/2-hydroxyethyl 5-norbornene-2-carboxylate/5-norbornene-2,3-dicarboxylic acid/maleic anhydride) represented by Chemical Formula 104 shown above (yield: 30%).

EXAMPLE 5

Synthesis of Poly(1,1'-ethoxyethyl 5-Norbornene-2,3-dicarboxylate/2-Hydroxyethyl 5-Norbornene-2-carboxylate/5-Norbornene-2,3-dicarboxylic Acid/Maleic Anhydride)

<Chemical Formula 105>

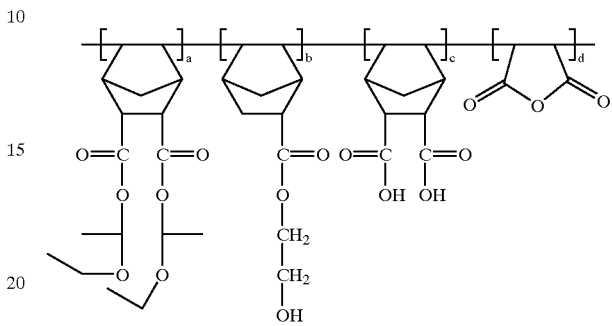

The procedure of the Example 2 was repeated but using 1,1'-ethoxyethyl 5-norbornene-2,3-dicarboxylate instead of di-tert-butyl 5-norbomene-2,3-dicarboxylate, to obtain poly (1,1'-ethoxyethyl 5-norbornene-2,3-dicarboxylate/2-hydroxyethyl 5-norbomene-2-carboxylate/5-norbomene-2,3-dicarboxylic acid/maleic anhydride) represented by Chemical Formula 105 shown above (yield: 32.5%).

EXAMPLE 6

Synthesis of Poly(1,1'-di-tert-butoxyethyl 5-Norbornene-2,3-dicarboxylate/2-Hydroxyethyl 5-Norbornene-2-carboxylate/5-Norbornene-2,3-dicarboxylic Acid/Maleic Anhydride)

<Chemical Formula 106>

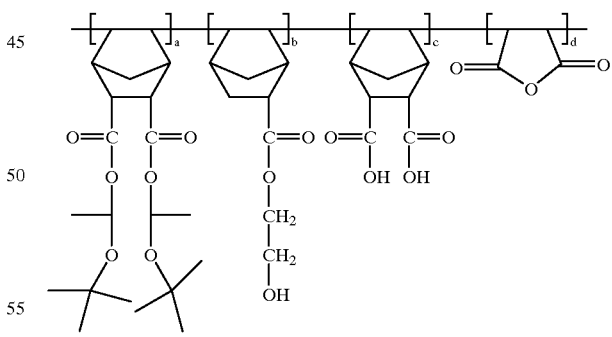

The procedure of the Example 2 was repeated but using 1,1'-di-tert-butoxyethyl 5-norbomene-2,3-dicarboxylate instead of di-tert-butyl 5-norbornene-2,3-dicarboxylate, to obtain poly(1,1'-di-tert-butoxyethyl 5-norbomene-2,3-dicarboxylate/2-hydroxyethyl 5-norbornene-2-carboxylate/5-norbomene-2,3-dicarboxylic acid/maleic anhydride) represented by Chemical Formula 106 shown above (yield: 32%).

EXAMPLE 7

Synthesis of Poly(di-tert-butyl 5-Norbornene-2,3-dicarboxylate/3-Hydroxypropyl 5-Norbornene-2-carboxylate/5-Norbornene-2,3-dicarboxylic Acid/Maleic Anhydride)

<Chemical Formula 107>

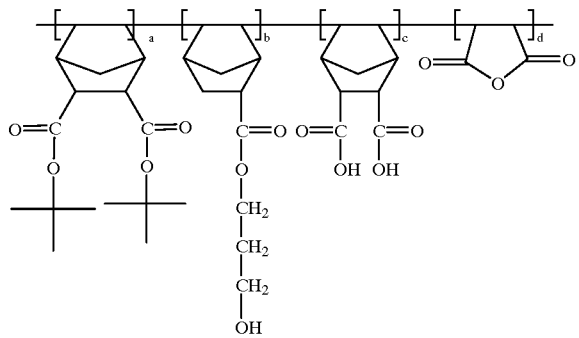

Di-tert-butyl 5-norbornene-2,3-dicarboxylate (0.85 mole), 3-hydroxypropyl 5-norbornene-2-carboxylate (0.1 mole), 5-norbornene-2,3-dicarboxylic acid (0.05 mole) and maleic anhydride (1 mole) were mixed together in tetrahydrofuran solvent, and AIBN (5.5 g) was added to the mixture as a polymerization initiator. Polymerization was performed under nitrogen atmosphere for 10 hours while maintaining the temperature at 67° C. When the polymerization was completed, the polymer was precipitated from ethyl ether and dried in vacuo to obtain pure poly(di-tert-butyl 5-norbornene-2,3-dicarboxylate/3-hydroxypropyl 5-norbornene-2-carboxylate/5-norbornene-2,3-dicarboxylic acid/maleic anhydride) of Chemical Formula 107 shown above (yield: 30%).

EXAMPLE 8

Synthesis of Poly(ditetrahydropyranyl 5-Norbornene-2,3-dicarboxylate/3-Hydroxypropyl 5-Norbornene-2-carboxylate/5-Norbornene-2,3-dicarboxylic Acid/Maleic Anhydride)

<Chemical Formula 108>

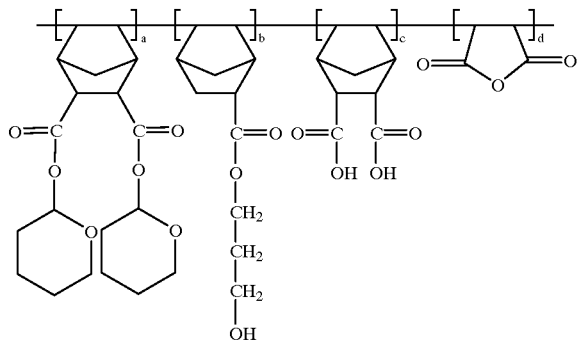

The procedure of the Example 7 was repeated but using ditetrahydropyranyl 5-norbornene-2,3-dicarboxylate instead of di-tert-butyl 5-norbornene-2,3-dicarboxylate, to obtain poly(ditetrahydropyranyl 5-norbornene-2,3-dicarboxylate/3-hydroxypropyl 5-norbornene-2-carboxylate/5-norbornene-2,3-dicarboxylic acid/maleic anhydride) represented by Chemical Formula 108 shown above (yield: 30.5%).

EXAMPLE 9

Synthesis of Poly(ditetrahydrofuranyl 5-Norbornene-2,3-dicarboxylate/3-Hydroxypropyl 5-Norbornene-2-carboxylate/5-Norbornene-2,3-dicarboxylic Acid/Maleic Anhydride)

<Chemical Formula 109>

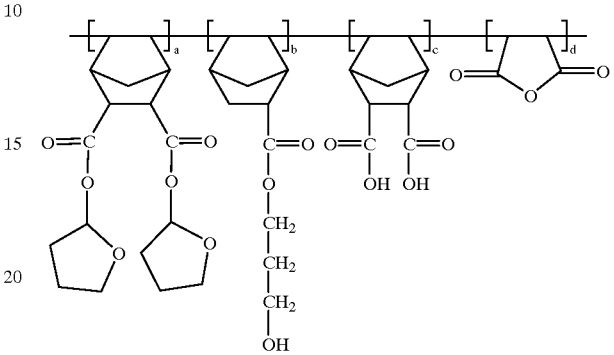

The procedure of the Example 7 was repeated but using ditetrahydrofuranyl 5-norbornene-2,3-dicarboxylate instead of di-tert-butyl 5-norbornene-2,3-dicarboxylate, to obtain poly(ditetrahydrofuranyl 5-norbornene-2,3-dicarboxylate/3-hydroxypropyl 5-norbornene-2-carboxylate/5-norbornene-2,3-dicarboxylic acid/maleic anhydride) represented by Chemical Formula 109 shown above (yield: 31%).

EXAMPLE 10

Synthesis of Poly(1,1'-ethoxyethyl 5-Norbornene-2,3-dicarboxylate/3-Hydroxypropyl 5-Norbornene-2-carboxylate/5-Norbornene-2,3-dicarboxylic Acid/Maleic Anhydride)

<Chemical Formula 110>

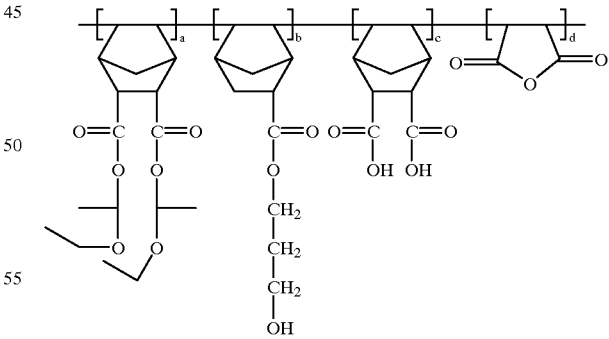

The procedure of Example 7 was repeated but using 1,1'-ethoxyethyl 5-norbornene-2,3-dicarboxylate instead of di-tert-butyl 5-norbornene-2,3-dicarboxylate, to obtain poly(1,1'-ethoxyethyl 5-norbornene-2,3-dicarboxylate/3-hydroxypropyl 5-norbornene-2-carboxylate/5-norbornene-2,3-dicarboxylic acid/maleic anhydride) represented by Chemical Formula 110 shown above (yield: 32.5%).

EXAMPLE 11

Synthesis of Poly(1,1'-di-tert-butoxyethyl 5-Norbomene-2,3-dicarboxylate/3-Hydroxypropyl 5-Norbornene-2-carboxylate/5-Norbomene-2,3-dicarboxylic Acid/Maleic Anhydride)

<Chemical Formula 111>

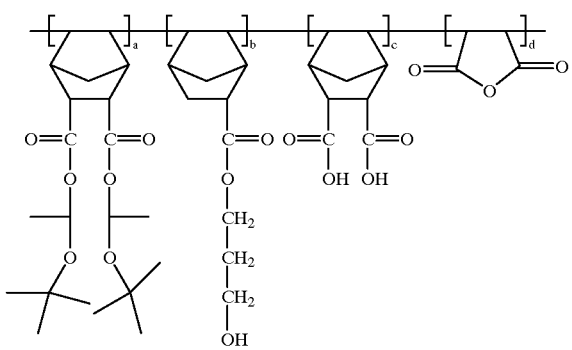

The procedure of Example 7 was repeated but using 1,1'-di-tert-butoxyethyl 5-norbornene-2,3-dicarboxylate instead of di-tert-butyl 5-norbomene-2,3-dicarboxylate, to obtain poly(1,1'-di-tert-butoxyethyl 5-norbornene-2,3-dicarboxylate/3-hydroxypropyl 5-norbornene-2-carboxylate/5-norbornene-2,3-dicarboxylic acid/maleic anhydride) represented by Chemical Formula 111 shown above (yield: 30%).

EXAMPLE 12

Synthesis of Poly(tert-butyl 5-Norbornene-2-carboxylate/2-Hydroxyethyl 5-Norbomene-2-carboxylate/5-Norbornene-2,3-dicarboxylic Acid/Maleic Anhydride)

<Chemical Formula 112>

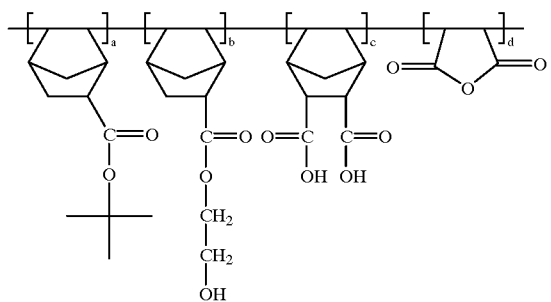

The procedure of Example 2 was repeated but using tert-butyl 5-norbornene-2-carboxylate instead of di-tert-butyl 5-norbomene-2,3-dicarboxylate, to obtain poly(tert-butyl 5-norbomene-2-carboxylate/2-hydroxyethyl 5-norbornene-2-carboxylate/5-norbomene-2,3-dicarboxylic acid/maleic anhydride) represented by Chemical Formula 112 shown above (yield: 30.5%).

EXAMPLE 13

Synthesis of Poly(tert-butyl 5-Norbomene-2-carboxylate/3-Hydroxypropyl 5-Norbomene-2-carboxylate/5-Norbornene-2,3-dicarboxylic Acid/Maleic Anhydride)

<Chemical Formula 113>

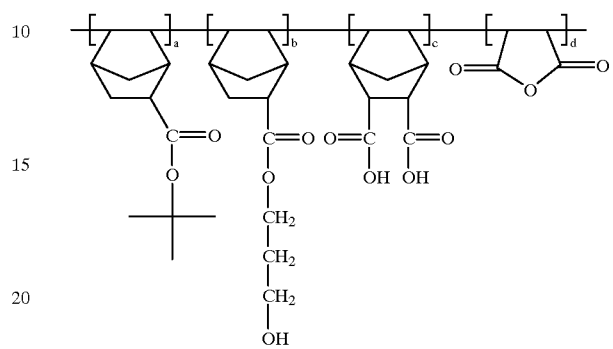

The procedure of Example 7 was repeated but using 3-hydroxypropyl 5-norbornene-2-carboxylate instead of 2-hydroxyethyl-5-norbornene-2-carboxylate, to obtain poly(tert-butyl 5-norbomene-2-carboxylate/3-hydroxypropyl 5-norbornene-2-carboxylate/5-norbomene-2,3-dicarboxylic acid/maleic anhydride) represented by Chemical Formula 113 shown above (yield: 31%).

Synthesis of Photoresist Composition and Pattern Formation

EXAMPLE 14

The polymer obtained from Example 2 (10 g) and triphenylsulfonium triflate (1.12 g) as a photoacid generator were dissolved in ethyl 3-ethoxypropionate solvent (60 g), and the solution was filtered through a 0.10 μm filter to obtain a PR composition. The composition obtained was spin-coated on a silicon wafer, and baked at 110° C. for 90 seconds. After baking, the coated wafer was exposed to light by using an ArF laser exposing device, and then baked again at 110° C. for 90 seconds. When the baking was completed, it was developed in 2.38 wt % aqueous tetramethylammonium hydroxide (TMAH) solution for 40 seconds to obtain the 0.13 μm L/S pattern as shown in FIG. 1. Alternatively, KrF, E-beam, EUV, ion-beam, X-ray, VUV(vacuum ultraviolet) or ion beam may be used instead of ArF as a light source.

EXAMPLE 15

The procedure according to Example 14 was repeated but using the polymer obtained from Example 3 instead of that from Example 2, to obtain a 0.14 μm L/S pattern.

EXAMPLE 16

The procedure according to Example 14 was repeated but using the polymer obtained from Example 4 instead of that from Example 2, to obtain a 0.14 μm L/S pattern.

EXAMPLE 17

Figure 2:
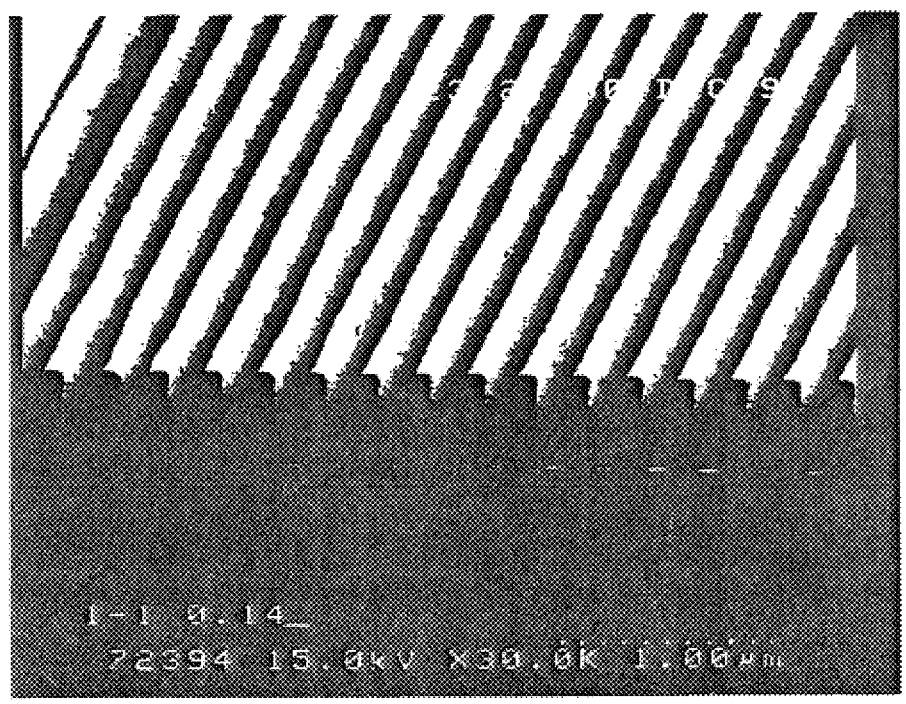
FIG. 2 is a SEM photograph showing a photoresist pattern that was obtained according to another embodiment of the present invention.

The procedure according to Example 14 was repeated but using the polymer obtained from Example 5 instead of that from Example 2, to obtain the 0.14 μm L/S pattern shown in FIG. 2.

EXAMPLE 18

Figure 3:
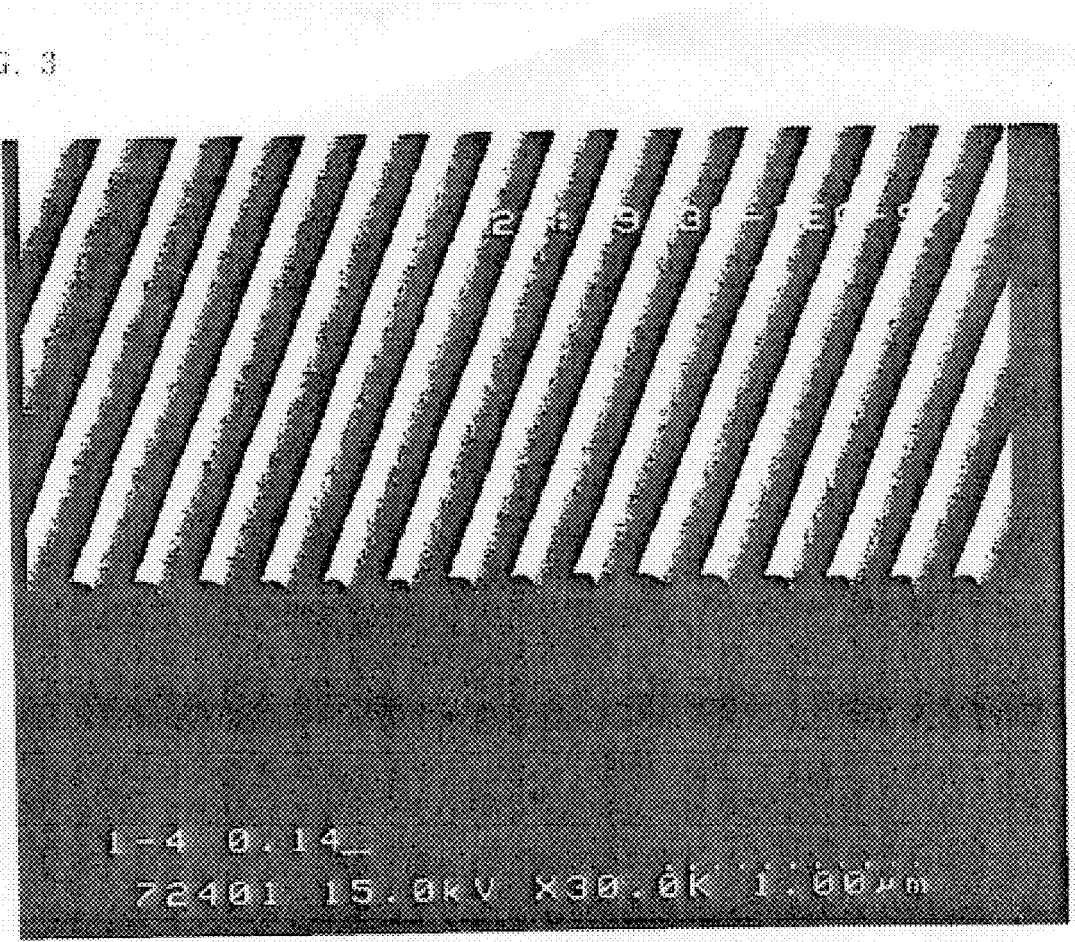
FIG. 3 is a SEM photograph showing a photoresist pattern that was obtained according to another embodiment of the present invention.

The procedure according to Example 14 was repeated but using the polymer obtained from Example 6 instead of that from Example 2, to obtain the 0.14 μm L/S pattern shown in FIG. 3.

EXAMPLE 19

The procedure according to Example 14 was repeated but using the polymer obtained from Example 7 instead of that from Example 2, to obtain a 0.14 μm L/S pattern.

EXAMPLE 20

The procedure according to Example 14 was repeated but using the polymer obtained from Example 8 instead of that from Example 2, to obtain a 0.14 μm L/S pattern.

EXAMPLE 21

The procedure according to Example 14 was repeated but using the polymer obtained from Example 9 instead of that from Example 2 to obtain a 0.14 μm L/S pattern.

EXAMPLE 22

The procedure according to Example 14 was repeated but using the polymer obtained from Example 10, to obtain a 0.14 μm L/S pattern.

EXAMPLE 23

The procedure according to Example 14 was repeated but using the polymer obtained from Example 11 instead of that from Example 2, to obtain a 0.14 μm L/S pattern.

EXAMPLE 24

The procedure according to Example 14 was repeated but using the polymer obtained from Example 12 instead of that from Example 2, to obtain a 0.14 μm L/S pattern.

EXAMPLE 25

The procedure according to Example 14 was repeated but using the polymer obtained from Example 13 instead of that from Example 2, to obtain a 0.14 μm L/S pattern.

What is claimed is:

1. A photoresist copolymer derived from a mixture of monomers comprising:
   (i) a first monomeric compound of the formula:

<Chemical Formula 2>

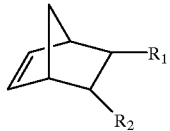

wherein, $R_1$ and $R_2$ are independently —COOH or —R—COOH and R is a substituted or unsubstituted (C1–C10) alkylene; and
   (ii) a second monomeric compound of the formula:

<Chemical Formula 4>

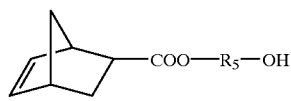

wherein, $R_5$ is a substituted or unsubstituted (C1–C10) alkylene.

2. A copolymer according to the claim 1, wherein said R5 is unsubstituted, and is a linear or branched C1–C5 alkyl.

3. A copolymer according to the claim 1, wherein said R5 is ethyl, propyl or branched C3–C5 alkyl.

4. A copolymer according to the claim 1, wherein said copolymer further comprises at least one monomer selected from the group consisting of maleic anhydride, maleimide derivatives and vinylenecarbonate.

5. A copolymer according to the claim 1, wherein said mixture of monomers further comprises a third monomeric compound of the formula:

<Chemical Formula 3>

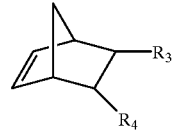

wherein, $R_3$ is —COOR* or —R'—COOR*; R* is an acid liable group; R' is a substituted or unsubstituted (C1–C10) alkylene; and R4 is H or $R_3$.

6. A copolymer according to the claim 5, wherein said R* is substituted or unsubstituted C1–C20 alkyl.

7. A copolymer according to the claim 5, wherein said R* is selected from the group consisting of tert-butyl, tetrahydropyranyl, tetrahydrofuranyl, ethoxyethyl and tert-butoxyethyl.

8. A copolymer according to claim 5, wherein the compound represented by Chemical Formula 3 is ditert-butyl 5-norbornene-2,3-dicarboxylate; ditetrahydropyranyl 5-norbomene-2,3-dicarboxylate; ditetrahydrofuranyl 5-norbornene-2,3-dicarboxylate; 1,1'-diethoxyethyl 5-norbomene-2,3-dicarboxylate; 1,1'-di-tert-butoxyethyl 5-norbomene-2,3-dicarboxylate; tert-butyl 5-norbornene-2-carboxylate; tetrahydropyranyl 5-norbomene-2-carboxylate; tetrahydrofuranyl 5-norbomene-2-carboxylate; ethoxyethyl 5-norbomene-2-carboxylate; or tert-butoxyethyl 5-norbomene-2-carboxylate.

9. A copolymer according to the claim 5, represented by the following Chemical Formula 100:

<Chemical Formula 100>

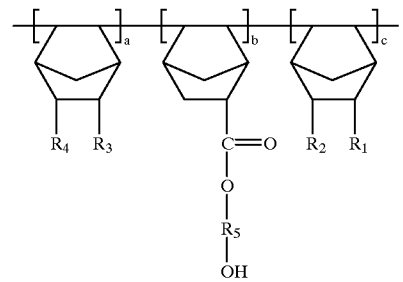

wherein,
$R_1$ and $R_2$ are independently —COOH or —R—COOH;
R is a substituted or unsubstituted (C1–C10) alkylene;
$R_3$ is —COOR* or —R'—COOR*; R* is an acid labile group; R' is a substituted or unsubstituted (C1–C10) alkylene;
$R_4$ is H or $R_3$;
$R_5$ is a substituted or unsubstituted (C1–C10) alkylene; and
a:b:c is the polymerization ratio of the comonomers.

10. A copolymer according to the claim 5, represented by the following Chemical Formula 101:

<Chemical Formula 101>

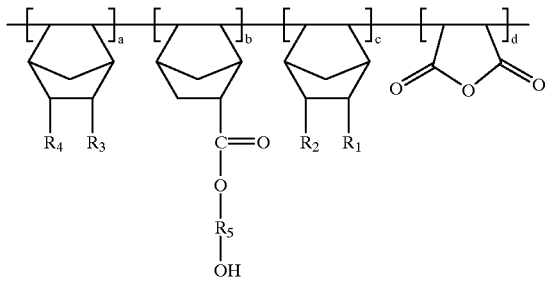

wherein, $R_1$ and $R_2$ are independently —COOH or —R—COOH; R is a substituted or unsubstituted (C1–C10) alkylene;

$R_3$ is —COOR* or —R'—COOR*; R* is an acid labile-group; R' is a substituted or unsubstituted (C1–C10) alkylene;

$R_4$ is H or $R_3$;

$R_5$ is a substituted or unsubstituted (C1–C10) alkylene; and a:b:c is the polymerization ratio of the comonomers.

11. A copolymer according to claim 10, wherein said copolymer is poly(di-tert-butyl 5-norbomene-2,3-dicarboxylate/2-hydroxyethyl 5-norbomene-2-carboxylate/5-norbomene-2,3-dicarboxylic acid/maleic anhydride); poly(ditetrahydropyranyl 5-norbornene-2,3-dicarboxylate/2-hydroxyethyl 5-norbornene-2-carboxylate/5-norbomene-2,3-dicarboxylic acid/maleic anhydride); poly(ditetrahydrofuranyl 5-norbornene-2,3-dicarboxylate/2-hydroxyethyl 5-norbornene-2-carboxylate/5-norbomene-2,3-dicarboxylic acid/maleic anhydride); poly(1,1'-ethoxyethyl 5-norbomene-2,3-dicarboxylate/2-hydroxyethyl 5-norbornene-2-carboxylate/5-norbomene-2,3-dicarboxylic acid/maleic anhydride); poly(1,1'-di-tert-butoxyethyl 5-norbomene-2,3-dicarboxylate/2-hydroxyethyl 5-norbomene-2-carboxylate/5-norbomene-2,3-dicarboxylic acid/maleic anhydride); poly(di-tert-butyl 5-norbornene-2,3-dicarboxylate/3-hydroxypropyl 5-norbornene-2-carboxylate/5-norbornene-2,3-dicarboxylic acid/maleic anhydride); poly(ditetrahydropyranyl 5-norbomene-2,3-dicarboxylate/3-hydroxypropyl 5-norbornene-2-carboxylate/5-norbornene-2,3-dicarboxylic acid/maleic anhydride); poly(ditetrahydrofuranyl 5-norbomene-2,3-dicarboxylate/3-hydroxypropyl 5-norbornene-2-carboxylate/5-norbornene-2,3-dicarboxylic acid/maleic anhydride); poly(1,1'-ethoxyethyl 5-norbomene-2,3-dicarboxylate/3-hydroxypropyl 5-norbornene-2-carboxylate/5-norbornene-2,3-dicarboxylic acid/maleic anhydride); poly(1,1'-di-tert-butoxyethyl 5-norbornene-2,3-dicarboxylate/3-hydroxypropyl 5-norbornene-2-carboxylate/5-norbornene-2,3-dicarboxylic acid/maleic anhydride); poly(tert-butyl 5-norbornene-2-carboxylate/2-hydroxyethyl 5-norbomene-2-carboxylate/5-norbomene-2,3-dicarboxylic acid/maleic anhydride); or poly(tert-butyl 5-norbornene-2-carboxylate/3-hydroxypropyl 5-norbornene-2-carboxylate/5-norbornene-2,3-dicarboxylic acid/maleic anhydride).

12. A process for preparing a photoresist copolymer comprising:

polymerizing a mixture of monomers in the presence of a polymerization initiator under conditions sufficient to produce the photoresist copolymer, wherein the mixture of monomers comprises:
(i) a compound of Chemical Formula 2;

<Chemical Formula 2>

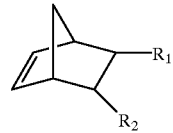

wherein $R_1$ and $R_2$ are independently —COOH or —R—COOH and R is a substituted or unsubstituted (C1–C10) alkylene; and (ii)-a compound of Chemical Formula 4:

<Chemical Formula 4>

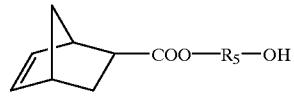

wherein, $R_5$ is a substituted or unsubstituted (C1–C10) alkylene.

13. A process for preparing a copolymer according to claim 12, wherein the polymerization initiator is a radical polymerization initiator.

14. A process for preparing a copolymer according to claim 13, wherein the radical polymerization initiator is selected from the group consisting of 2,2-azo-bis-isobutyronitrile (AIBN), acetyl peroxide, lauryl peroxide and tert-butyl peroxide.

15. A process for preparing a copolymer according to claim 12, wherein the polymerization reaction is performed at 40 to 90° C. for 4 to 20 hours.

16. The process of claim 12, wherein the mixture of monomers further comprises a compound of Chemical Formula 3:

<Chemical Formula 3>

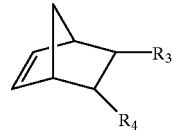

wherein $R_3$ is —COOR* or —R'—COOR*; R* is an acid liable group; R' is a substituted or unsubstituted (C1–C10) alkylene; and R4 is H or $R_3$.

17. The process of claim 16, wherein the mixture of monomers further comprises a compound selected from the group consisting of maleic anhydride, maleimide derivatives and vinylene carbonate.

18. A process for preparing a photoresist copolymer comprising:

polymerizing a mixture of monomers in the presence of a metallic catalyst under conditions sufficient to produce the photoresist copolymer, wherein the mixture of monomers comprises:

(i) a compound of Chemical Formula 2;

<Chemical Formula 2>

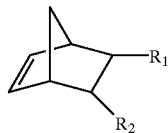

wherein $R_1$ and $R_2$ are independently —COOH or —R—COOH; and R is a substituted or unsubstituted (C1–C10) alkylene; and a compound of Chemical Formula 4:

<Chemical Formula 4>

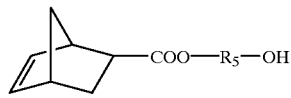

wherein, $R_5$ is a substituted or unsubstituted (C1–C10) alkylene.

19. The process of claim 18, wherein the mixture of monomers further comprises a compound of Chemical Formula 3:

<Chemical Formula 3>

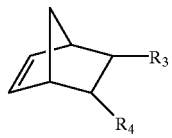

wherein $R_3$ is —COOR* or —R'—COOR*; R* is an acid liable group; R' is a substituted or unsubstituted (C1–C10) alkylene; and $R_4$ is H or $R_3$.

20. A photoresist composition which comprises:
   (a) a photoresist copolymer of the claim 1,
   (b) a photoacid generator, and
   (c) an organic solvent.

21. A photoresist composition according to claim 20, wherein the photoacid generator is triphenylsulfonium triflate or dibutylnaphthyl sulfonium triflate.

22. A photoresist composition according to claim 20, wherein the organic solvent is selected from the group consisting of ethyl 3-ethoxypropionate, methyl 3-methoxypropionate, cyclohexanone and propylene glycol methyl ether acetate.

23. A photoresist composition according to claim 20, wherein the amount of the solvent is from 200 to 1000 wt % of the amount of the copolymer.

24. A photoresist composition according to claim 20 wherein the amount of the photoacid generator is from 0.05 to 10 wt % of amount of the copolymer.

25. A process for preparing a photoresist composition, which comprises the steps of:
   (a) dissolving the copolymer of claim 11 and a photoacid generator in an organic solvent, and
   (b) filtering the resultant solution.

26. A process for forming a photoresist pattern, which comprises the steps of:
   (a) coating the photoresist composition of claim 20 on a wafer,
   (b) exposing the wafer to light, and
   (c) developing the exposed wafer with a developing solution to obtain a predetermined pattern.

27. A process for forming a photoresist pattern according to claim 26, said process further comprising the step of baking the wafer before and/or after exposing step (b).

28. A process for forming a photoresist pattern according to claim 26, wherein the exposing step (b) is carried out by using ArF, KrF, E-beam, EUV, VUV, X-ray or ion beam.

29. A semiconductor element comprising the photoresist composition of the claim 20.

* * * * *

UNITED STATES PATENT AND TRADEMARK OFFICE
CERTIFICATE OF CORRECTION

PATENT NO.    : 6,391,518 B1
DATED         : May 21, 2002
INVENTOR(S)   : Min Ho Jung et al.

It is certified that error appears in the above-identified patent and that said Letters Patent is hereby corrected as shown below:

Column 3,
Lines 64-65, the phrase "5-norbomene-2,3-dicarboxylic acid;" should read
-- 5-norbornene-2,3-dicarboxylic acid; --.

Column 5,
Lines 53-64, please replace all occurrences of "norbomene" with -- norbornene --.

Column 7,
Line 23, the phrase "polymer 0 0 employed" should read -- polymer employed --.

Column 8,
Lines 30-67, please replace all occurrences of "norbomene" with -- norbornene --.

Column 9,
Lines 1-7, please replace all occurrences of "norbomene" with -- norbornene --.

Column 10,
Lines 25-67, please replace all occurrences of "norbomene" with -- norbornene --.

Column 11,
Lines 1-67, please replace all occurrences of "norbomene" with -- norbornene --.

Column 12,
Lines 1-67, please replace all occurrences of "norbomene" with -- norbornene --.

Column 13,
Lines 1-67, please replace all occurrences of "norbomene" with -- norbornene --.

Column 14,
Lines 1-30, please replace all occurrences of "norbomene" with -- norbornene --.

Column 16,
Lines 30-40, please replace all occurrences of "norbomene" with -- norbornene --.

Column 17,
Lines 30-67, please replace all occurrences of "norbomene" with -- norbornene --.

UNITED STATES PATENT AND TRADEMARK OFFICE
CERTIFICATE OF CORRECTION

PATENT NO.    : 6,391,518 B1
DATED         : May 21, 2002
INVENTOR(S)   : Min Ho Jung et al.

It is certified that error appears in the above-identified patent and that said Letters Patent is hereby corrected as shown below:

<u>Column 20,</u>
Lines 19-24, the claim "A process for preparing a photoresist composition, which comprises the steps of: (a) dissolving the copolymer of claim 11 and a photoacid generator in an organic solvent, and (b) filtering the resultant solution." should read
-- A process for preparing a photoresist composition, which comprises the steps of: (a) dissolving the copolymer of claim 1 and a photoacid generator in an organic solvent, and (b) filtering the resultant solution. --

Signed and Sealed this

Twenty-third Day of March, 2004

JON W. DUDAS
*Acting Director of the United States Patent and Trademark Office*